(12) United States Patent
Kim et al.

(10) Patent No.: US 12,418,174 B2
(45) Date of Patent: Sep. 16, 2025

(54) DISPLAY DEVICE

(71) Applicant: Samsung Display Co., LTD., Yongin-si (KR)

(72) Inventors: Kwi Hyun Kim, Yongin-si (KR); Byoung Sun Na, Yongin-si (KR); Sang Yong No, Yongin-si (KR); Jong Woong Chang, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 152 days.

(21) Appl. No.: 17/949,334

(22) Filed: Sep. 21, 2022

(65) Prior Publication Data

US 2023/0142014 A1    May 11, 2023

(30) Foreign Application Priority Data

Nov. 8, 2021    (KR) .................. 10-2021-0152325

(51) Int. Cl.
  *H02H 9/04*    (2006.01)
  *H10D 89/60*    (2025.01)
  (Continued)

(52) U.S. Cl.
  CPC .............. *H02H 9/045* (2013.01); *H02H 9/04* (2013.01); *H10D 89/811* (2025.01);
  (Continued)

(58) Field of Classification Search
  CPC .......... H02H 9/04; H02H 9/045; H01L 33/38; H01L 27/02; H01L 33/382;
  (Continued)

(56) References Cited

U.S. PATENT DOCUMENTS

| | | | |
|---|---|---|---|
| 10,318,227 B2 | 6/2019 | Shin et al. | |
| 2006/0017672 A1* | 1/2006 | Aoki ...................... | G09G 3/325 345/77 |

(Continued)

FOREIGN PATENT DOCUMENTS

| | | |
|---|---|---|
| KR | 10-2009-0072297 | 7/2009 |
| KR | 10-1789126 | 10/2017 |

(Continued)

*Primary Examiner* — Danny Nguyen
(74) *Attorney, Agent, or Firm* — Womble Bond Dickinson (US) LLP

(57) ABSTRACT

A display device includes a base layer including a display area and a non-display area, an emission unit including a first electrode electrically connected to a first driving power source, a second electrode electrically connected to a second driving power source, and a light-emitting element disposed between first and second electrodes, a first transistor including a first terminal electrically connected to the first driving power source, a second terminal electrically connected to the first electrode of the emission unit, and a gate electrode electrically connected to a first node, a second transistor including a first terminal electrically connected to a data line, a second terminal electrically connected to the first node, and a gate electrode electrically connected to a scan line, and an electrostatic discharge circuit disposed in the display area and disposed between the first driving power source and the data line.

20 Claims, 13 Drawing Sheets

(51) Int. Cl.
   *H10H 20/831* (2025.01)
   *H10H 20/857* (2025.01)
   *G09G 3/32* (2016.01)
   *H01L 25/16* (2023.01)

(52) U.S. Cl.
   CPC ...... *H10H 20/8312* (2025.01); *H10H 20/857* (2025.01); *G09G 3/32* (2013.01); *G09G 2300/0426* (2013.01); *G09G 2300/0842* (2013.01); *H01L 25/167* (2013.01)

(58) Field of Classification Search
   CPC ................ H01L 27/0266; H01L 27/62; G09G 2300/0426; G09G 2300/0842; G09G 23/10061; G02F 1/3225
   USPC .......................................................... 361/56
   See application file for complete search history.

(56) References Cited

U.S. PATENT DOCUMENTS

| | | | | |
|---|---|---|---|---|
| 2019/0155113 | A1* | 5/2019 | Zeng ................. | G02F 1/136286 |
| 2019/0304386 | A1* | 10/2019 | Kim ......................... | G09G 3/30 |
| 2021/0202675 | A1* | 7/2021 | Jang ..................... | H10K 59/122 |
| 2022/0180784 | A1* | 6/2022 | Liu .......................... | G09G 3/20 |

FOREIGN PATENT DOCUMENTS

| | | |
|---|---|---|
| KR | 10-1905027 | 12/2018 |
| KR | 10-2252147 | 5/2021 |

\* cited by examiner

DISPLAY DEVICE

CROSS-REFERENCE TO RELATED APPLICATION(S)

This application claims priority to and benefits of Korean Patent Application No. 10-2021-0152325 under 35 U.S.C. § 119, filed on Nov. 8, 2021 in the Korean Intellectual Property Office, the entire contents of which are incorporated herein by reference.

BACKGROUND

1. Technical Field

The disclosure relates to a display device having an electrostatic discharge circuit.

2. Description of the Related Art

With an increase in interest in an information display and an increase in demand to use portable information media, demand for display devices is markedly increased, and commercialization thereof is progressing.

SUMMARY

Various embodiments of the disclosure are directed to a display device for discharging static electricity flowing into a display area.

An embodiment of the disclosure may provide for a display device. The display device may include a base layer including a display area and a non-display area adjacent to the display area; an emission unit including a first electrode electrically connected to a first driving power source, a second electrode electrically connected to a second driving power source, and a light-emitting element electrically disposed between the first electrode and the second electrode; a first transistor including a first terminal electrically connected to the first driving power source, a second terminal electrically connected to the first electrode of the emission unit, and a gate electrode electrically connected to a first node; a second transistor including a first terminal electrically connected to a data line, a second terminal electrically connected to the first node, and a gate electrode electrically connected to a scan line; and an electrostatic discharge circuit disposed in the display area and disposed between the first driving power source and the data line.

The electrostatic discharge circuit may be electrically connected to the first transistor and the second transistor.

The electrostatic discharge circuit may include a first discharge transistor including a first terminal electrically connected to the first driving power source, a second terminal electrically connected to a third node, and a gate electrode electrically connected to the third node; and a second discharge transistor including a first terminal electrically connected to the third node, a second terminal electrically connected to the data line, and a gate electrode electrically connected to the data line.

The electrostatic discharge circuit may include a third discharge transistor including a first terminal electrically connected to the data line, a second terminal electrically connected to a fourth node, and a gate electrode electrically connected to the fourth node; and a fourth discharge transistor including a first terminal electrically connected to the fourth node, a second terminal electrically connected to the first driving power source, and a gate electrode electrically connected to the first driving power source.

The display device may further include an outer discharge transistor disposed in the non-display area, the outer discharge transistor including a first terminal electrically connected to the data line, a second terminal electrically connected to an outer connection line, and a gate electrode electrically connected to the outer connection line.

A voltage of the first driving power source may be higher than a voltage of the second driving power source.

The display device may further include a third transistor including a first terminal electrically connected to the first terminal of the first transistor, a second terminal electrically connected to a sensing line, and a gate electrode electrically connected to the sensing line; and a storage capacitor including a first electrode electrically connected to the first node and a second electrode electrically connected to the second electrode of the first transistor.

The light-emitting element may include a first semiconductor layer; a second semiconductor layer; and an active layer disposed between the first semiconductor layer and the second semiconductor layer.

An embodiment of the disclosure may provide for a display device. The display device may include a base layer including a display area and a non-display area adjacent to the display area; an emission unit including a first electrode electrically connected to a first driving power source, a second electrode electrically connected to a second driving power source different from the first driving power source, and a light-emitting element disposed between the first electrode and the second electrode; a first transistor including a first terminal electrically connected to the first driving power source, a second terminal electrically connected to the first electrode of the emission unit, and a gate electrode electrically connected to a first node; a second transistor including a first terminal electrically connected to a data line, a second terminal electrically connected to the first node, and a gate electrode electrically connected to a scan line; and an electrostatic discharge circuit disposed in the display area and disposed between the first driving power source and the data line, the electrostatic discharge circuit being controlled by the second driving power source.

The electrostatic discharge circuit may be electrically connected to the first transistor and the second transistor.

The electrostatic discharge circuit may include a fifth discharge transistor including a first terminal electrically connected to the first driving power source, a second terminal electrically connected to the data line, and a gate electrode electrically connected to the second driving power source.

The electrostatic discharge circuit may include a sixth discharge transistor including a first terminal electrically connected to the first driving power source, a second terminal electrically connected to a fifth node, and a gate electrode electrically connected to the second driving power source; and a seventh discharge transistor including a first terminal electrically connected to the fifth node, a second terminal electrically connected to the data line, and a gate electrode electrically connected to the second driving power source.

The display device may further include an outer discharge transistor disposed in the non-display area, the outer discharge transistor including a first terminal electrically connected to the data line, a second terminal electrically connected to an outer connection line, and a gate electrode electrically connected to the outer connection line.

A voltage of the first driving power source may be higher than a voltage of the second driving power source.

The display device may further include a third transistor including a first terminal electrically connected to the first terminal of the first transistor, a second terminal electrically connected to a sensing line, and a gate electrode electrically connected to the sensing line; and a storage capacitor including a first electrode electrically connected to the first node and a second electrode electrically connected to the second electrode of the first transistor.

The light-emitting element may include a first semiconductor layer; a second semiconductor layer; and an active layer disposed between the first semiconductor layer and the second semiconductor layer.

An embodiment of the disclosure may provide for a display device. The display device may include a base layer including a plurality of pixels arranged in a first direction and a second direction perpendicular to the first direction. Each of the plurality of pixels may include an emission unit including a first electrode electrically connected to a first driving power source, a second electrode electrically connected to a second driving power source, and a light emitting element disposed between the first electrode and the second electrode; and a pixel circuit including a first transistor, the first transistor including a first terminal electrically connected to the first driving power source, a second terminal electrically connected to the first electrode of the emission unit, and a gate electrode electrically connected to a first node. The plurality of pixels may include at least one pixel including an electrostatic discharge circuit disposed between the first driving power source and a data line.

The at least one pixel may correspond to at least one of pixels consecutive in the first direction and pixels consecutive in the second direction.

The electrostatic discharge circuit may be electrically connected to the second driving power source and is controlled by the second driving power source.

The light-emitting element may include a first semiconductor layer; a second semiconductor layer; and an active layer disposed between the first semiconductor layer and the second semiconductor layer.

DETAILED DESCRIPTION OF THE EMBODIMENTS

Figure 1:
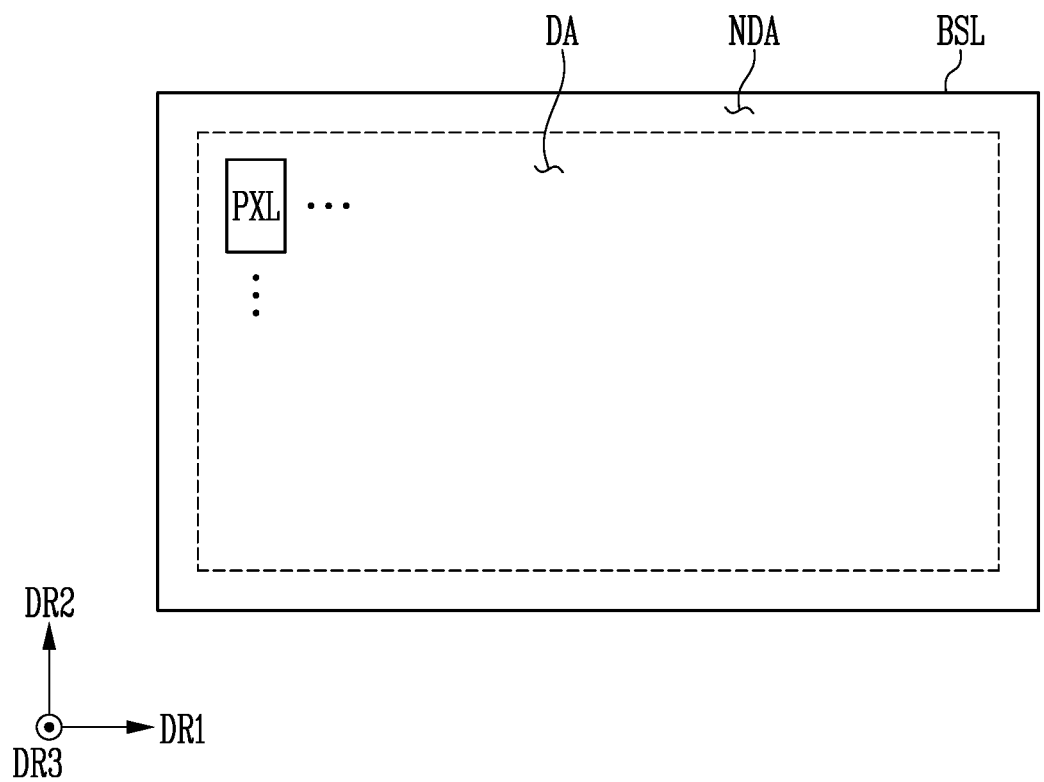
FIG. 1 is a schematic diagram illustrating a display device according to an embodiment.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

It should be noted that, although the terms "first", "second", etc. may be used herein to describe various elements, these elements should not be limited by these terms. These terms are only used to distinguish one element from another element. For instance, a first element may be termed a second element without departing from the teachings of the disclosure, and similarly, the second element may also be termed the first element. The singular forms are intended to include the plural forms as well, unless the context clearly indicates otherwise.

It should be understood that the terms "comprise" or "have" when used in this specification, specify the presence of stated features, numbers, steps, operations, elements, components, and/or combinations thereof but do not preclude the presence or addition of one or more other features, numbers, steps, operations, elements, components, and/or combinations thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Also, when an element is referred to as being "in contact" or "contacted" or the like to another element, the element may be in "electrical contact" or in "physical contact" with another element; or in "indirect contact" or in "direct contact" with another element.

Hereinafter, a display device according to an embodiment of the disclosure will be described with reference to the attached drawings.

FIG. 1 is a schematic diagram illustrating a display device according to an embodiment.

Referring to FIG. 1, the display device according to an embodiment may include a base layer BSL and multiple pixels PXL arranged on the base layer BSL.

The base layer BSL may form a base element of the display device. In accordance with an embodiment, the base layer BSL may be a rigid or flexible substrate or film, and the material or material property thereof is not especially limited. For example, the base layer BSL may be a rigid substrate formed of glass or tempered glass, a flexible substrate (or a thin film) formed of plastic or metal material, or at least one insulating layer, and the material and/or material property thereof are not especially limited.

The base layer BSL may include a display area DA in which an image is displayed and a non-display area NDA. The non-display area NDA may be an area in which an image is not displayed, and may be a bezel area surrounding the display area DA.

In the display area DA, a pixel PXL may be provided. Although only one pixel PXL is illustrated in FIG. 1, multiple pixels PXL may be distributed and arranged in the display area DA. For example, the pixels PXL may be disposed in the display area DA in an array structure such as a matrix or a stripe. However, the disclosure is not limited thereto.

The non-display area NDA may be disposed around the display area DA to surround the display area DA. The non-display area NDA may selectively include lines, pads, and driving circuits which are electrically coupled to the pixels PXL in the display area DA.

Hereinafter, pixels included in the display device according to an embodiment will be described in detail with reference to FIGS. 2 to 6.

Figure 2:
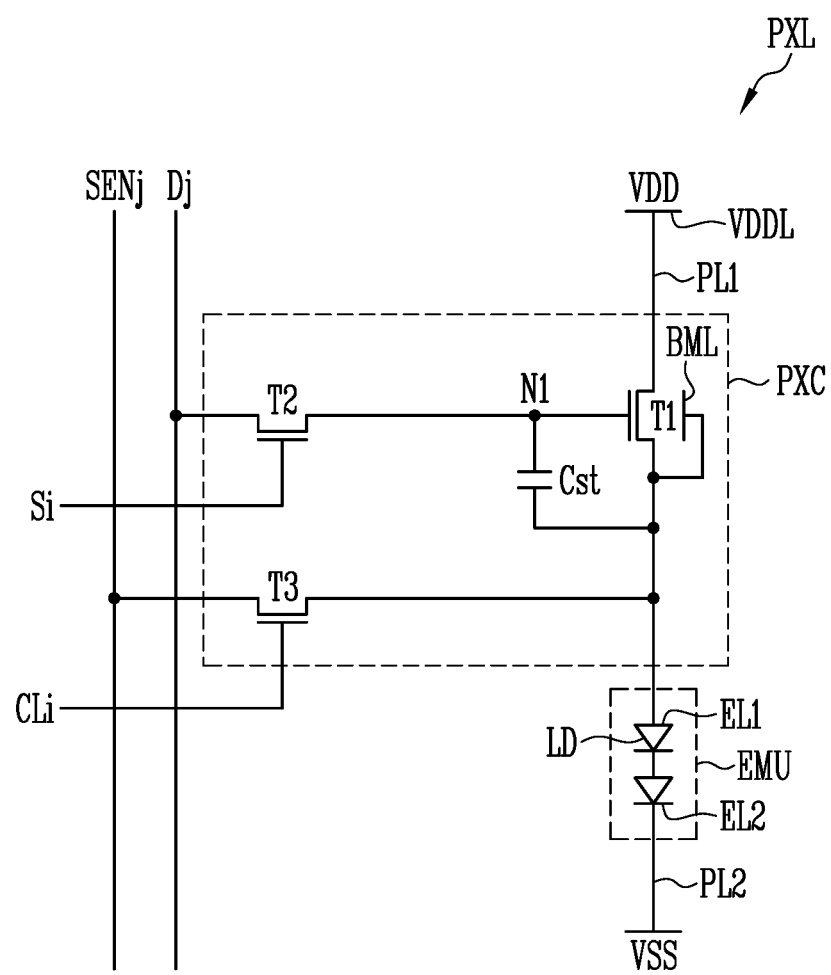
FIG. 2 is a schematic diagram of an equivalent circuit of a pixel included in a display device according to an embodiment.

FIG. 2 is a schematic diagram of an equivalent circuit of a pixel included in a display device according to an embodiment, and FIGS. 3 to 6 are schematic diagrams of an equivalent circuit of a pixel included in the display device according to an embodiment.

Referring to FIG. 2, a pixel PXL according to an embodiment may include at least one emission unit EMU configured to generate light with luminance corresponding to a data signal, and a pixel circuit PXC configured to drive the emission unit EMU.

The emission unit EMU may include a light-emitting element LD electrically connected in series with a first power line PL1 to which the voltage of the first driving power source VDD is applied and a second power line PL2 to which the voltage of a second driving power source VSS is applied. In detail, the emission unit EMU may include a first electrode EL1 electrically coupled to the first driving power source VDD through the pixel circuit PXC and the first power line PL1, a second electrode EL2 electrically coupled to the second driving power source VSS through the second power line PL2, and the light-emitting element LD electrically connected in series in the same direction between the first electrode EL1 and the second electrode EL2. In an embodiment, the first electrode EL1 may be an anode, and the second electrode EL2 may be a cathode. However, the disclosure is not limited thereto, and the first electrode EL1 may be a cathode, and the second electrode EL2 may be an anode. In an embodiment, the emission unit EMU may include one serial stage composed of light-emitting elements LD electrically connected in parallel to each other in the same direction, and may include a structure of n serial stages in which light-emitting elements LD are electrically coupled in a series or parallel combination.

Each of the light-emitting elements LD included in the emission unit EMU may include an end (or a first end) electrically coupled to the first driving power source VDD through the first electrode EL1 and another end (or a second end) coupled to the second driving power source VSS through the second electrode EL2.

The first driving power source VDD and the second driving power source VSS may have different potentials. For example, the first driving power source VDD may be a high-potential power source, and the second driving power source VSS may be a low-potential power source. For example, the voltage of the first driving power source VDD may be higher than that of the second driving power source VSS. Here, a potential difference between the first and second driving power sources VDD and VSS may be the threshold voltage of the light-emitting elements LD or more during an emission period of the pixel PXL.

The light-emitting elements LD of the emission unit EMU may emit light with luminance corresponding to a driving current supplied thereto through the pixel circuit PXC. For example, during each frame period, the pixel circuit PXC may supply a driving current corresponding to the grayscale value of one piece of frame data to the emission unit EMU.

The driving current supplied to the emission unit EMU may flow through the light-emitting elements LD. Accordingly, the emission unit EMU may emit light with luminance corresponding to the driving current while each light-emitting element LD emits light with luminance corresponding to a current flowing therethrough.

The pixel circuit PXC may be electrically coupled to a scan line Si and a data line Dj of one pixel PXL. For example, in case that the pixel PXL is arranged in an i-th row (where i is a natural number) and a j-th column (where j is a natural number) of the display area DA, the pixel circuit PXC may be electrically coupled to the i-th scan line Si and the j-th data line Dj of the display area DA. Also, the pixel circuit PXC may be electrically coupled to an i-th control line CLi and a j-th sensing line SENj of the display area DA.

The pixel circuit PXC may include a first transistor T1, a second transistor T2, a third transistor T3, and a storage capacitor Cst.

A first terminal of the first transistor T1 (or driving transistor) may be electrically coupled to the first driving power source VDD (or the first driving power line VDDL), a second terminal of the first transistor T1 may be electrically coupled to the first electrode EL1 of the emission unit EMU, and a gate electrode of the first transistor T1 may be electrically coupled to a first node N1. Accordingly, the first transistor T1 may control the amount of driving current supplied to the light-emitting elements LD in response to the voltage of the first node N1.

In an embodiment, the first transistor T1 may selectively include a bottom metal layer BML. The gate electrode of the first transistor T1 and the bottom metal layer BML may overlap each other with an insulating layer interposed therebetween.

A first terminal of the second transistor T2 (or switching transistor) may be electrically coupled to the data line Dj, a second terminal of the second transistor T2 may be electrically coupled to the first node N1, and a gate electrode of the second transistor T2 may be electrically coupled to the scan line Si. In case that a scan signal (high level) having a turn-on voltage is supplied from the scan line Si, the second transistor T2 may be turned on to electrically connect the data line Dj to the first node N1. In case that a data signal corresponding to one frame is supplied to the data line Dj, the data signal may be transferred to the first node N1. The data signal transferred to the first node N1 may be charged in the storage capacitor Cst.

The third transistor T3 may be electrically coupled between the first transistor T1 and the sensing line SENj. In detail, a first terminal of the third transistor T3 may be electrically coupled to the second terminal of the first transistor T1, a second terminal of the third transistor T3 may be electrically coupled to the sensing line SENj, and a gate electrode of the third transistor T3 may be electrically coupled to the control line CLi. The third transistor T3 may be turned on in response to the control signal (high level) having a gate-on voltage, supplied to the control line CLi during a sensing period, and may then electrically connect the sensing line SENj to the first transistor T1. The sensing period may be a period during which pieces of property information (e.g., the threshold voltage of the first transistor T1 or the like) of respective pixels PXL disposed in the display area DA are extracted.

A first electrode of the storage capacitor Cst may be electrically coupled to the first node N1, and a second electrode thereof may be electrically coupled to the second terminal of the first transistor T1. Such a storage capacitor Cst may charge a voltage corresponding to a difference between the voltage corresponding to the data signal supplied to the first node N1 and the voltage of the second terminal of the first transistor T1, and may maintain the charged voltage until a data signal corresponding to the next frame is supplied.

Although an embodiment in which the first to third transistors T1 to T3 are N-type transistors is illustrated in FIG. 2, the disclosure is not limited thereto. In an embodiment, at least one of the first to third transistors T1 to T3 may be replaced with a P-type transistor. Furthermore, although an embodiment in which the emission unit EMU is electrically coupled between the pixel circuit PXC and the second driving power source VSS is illustrated in FIG. 2, the emission unit EMU may also be electrically coupled between the first driving power source VDD and the pixel circuit PXC.

Referring to FIGS. 3 to 6, a pixel PXL according to an embodiment may include an emission unit EMU and a pixel circuit PXC, and may selectively further include an electrostatic discharge circuit ESDC configured to discharge static electricity flowing into a display area DA. The electrostatic discharge circuit ESDC may be electrically connected to the pixel circuit PXC (or a first transistor T1 and a second transistor T2), and may be disposed in the display area DA (see FIG. 1).

Figure 3:
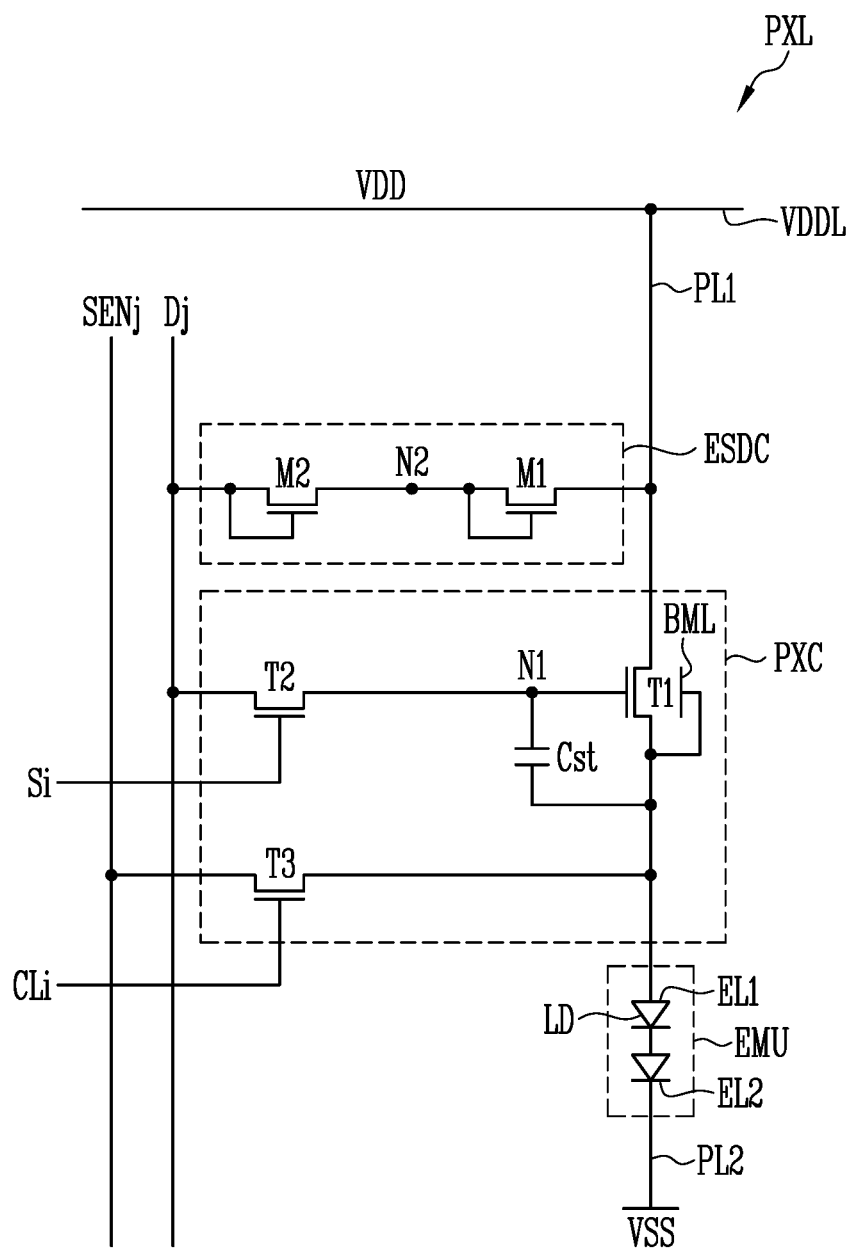
FIGS. 3 to 6 are schematic diagrams of an equivalent circuit of a pixel included in a display device according to an embodiment.

As illustrated in FIG. 3, in an embodiment, the electrostatic discharge circuit ESDC may include a first discharge transistor M1 and a second discharge transistor M2.

The first discharge transistor M1 and the second discharge transistor M2 may be electrically coupled between a first driving power source VDD and a data line Dj, and may be electrically connected in series to each other.

A first terminal of the first discharge transistor M1 may be electrically coupled to the first driving power source VDD, a second terminal of the first discharge transistor M1 may be electrically coupled to a second node N2, and a gate electrode of the first discharge transistor M1 may be electrically coupled to the second node N2 (or the second terminal of the first discharge transistor M1). For example, the first discharge transistor M1 may be a transistor having a diode structure.

A first terminal of the second discharge transistor M2 may be electrically coupled to the second node N2 (or the second terminal of the first discharge transistor M1), a second terminal of the second discharge transistor M2 may be electrically coupled to the data line Dj, and a gate electrode of the second discharge transistor M2 may be electrically coupled to the data line Dj (or the second terminal of the second discharge transistor M2). For example, the second discharge transistor M2 may be a transistor having a diode structure.

Figure 4:
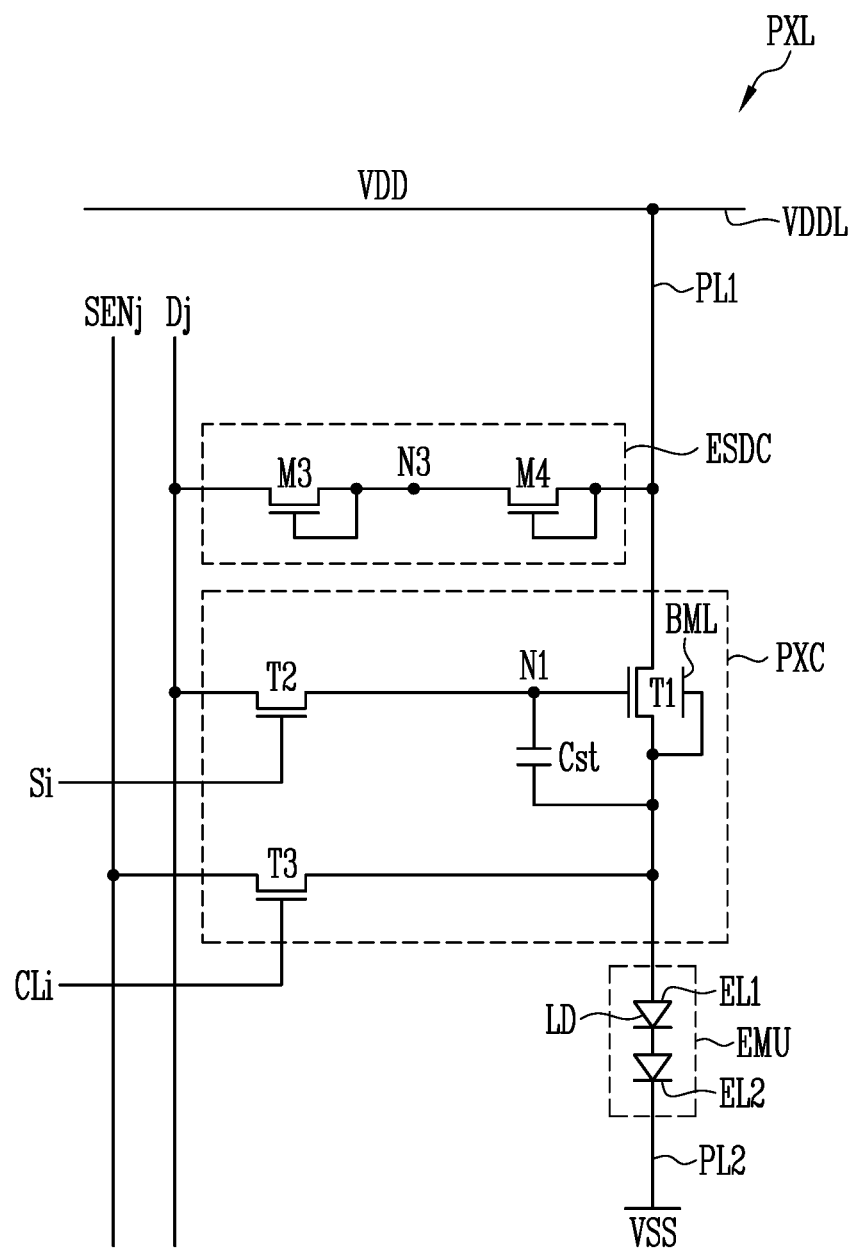

As illustrated in FIG. 4, in an embodiment, the electrostatic discharge circuit ESDC may include a third discharge transistor M3 and a fourth discharge transistor M4.

The third discharge transistor M3 and the fourth discharge transistor M4 may be electrically coupled between the first driving power source VDD and the data line Dj, and may be electrically connected in series to each other.

A first terminal of the third discharge transistor M3 may be electrically coupled to the data line Dj, a second terminal of the third discharge transistor M3 may be electrically coupled to a third node N3, and a gate electrode of the third discharge transistor M3 may be electrically coupled to the second terminal of the third discharge transistor M3 (or the third node N3). For example, the third discharge transistor M3 may be a transistor having a diode structure.

A first terminal of the fourth discharge transistor M4 may be electrically coupled to the third node N3 (or the second terminal of the third discharge transistor M3), a second terminal of the fourth discharge transistor M4 may be electrically coupled to the first driving power source VDD, and a gate electrode of the fourth discharge transistor M4 may be electrically coupled to the first driving power source VDD (or the second terminal of the fourth discharge transistor M4). For example, the fourth discharge transistor M4 may be a transistor having a diode structure.

Figure 5:
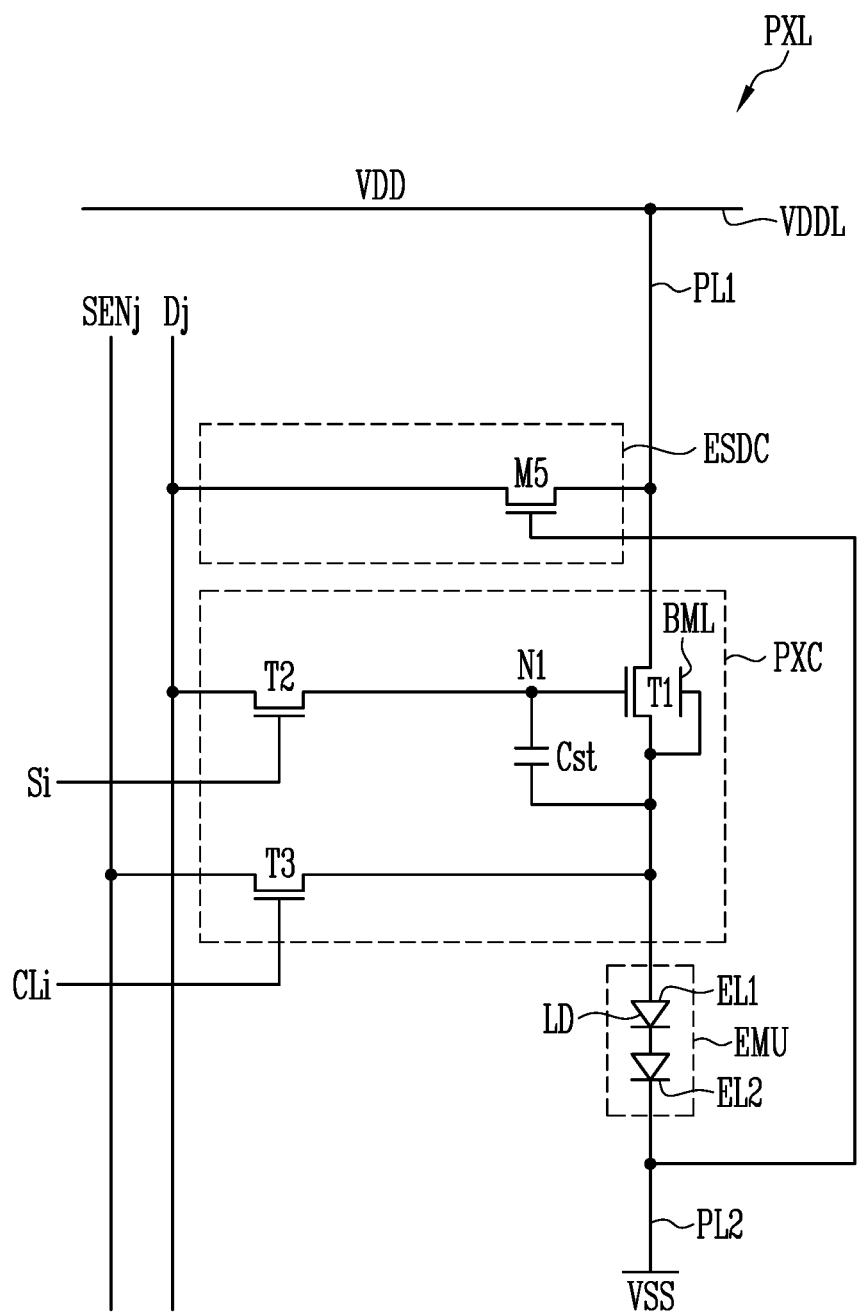

As illustrated in FIG. 5, in an embodiment, the electrostatic discharge circuit ESDC may include a fifth discharge transistor M5.

The fifth discharge transistor M5 may be electrically coupled between the first driving power source VDD and the data line Dj.

A first terminal of the fifth discharge transistor M5 may be electrically coupled to the first driving power source VDD, a second terminal of the fifth discharge transistor M5 may be electrically coupled to the data line Dj, and a gate electrode of the fifth discharge transistor M5 may be electrically coupled to the second driving power source VSS.

Figure 6:
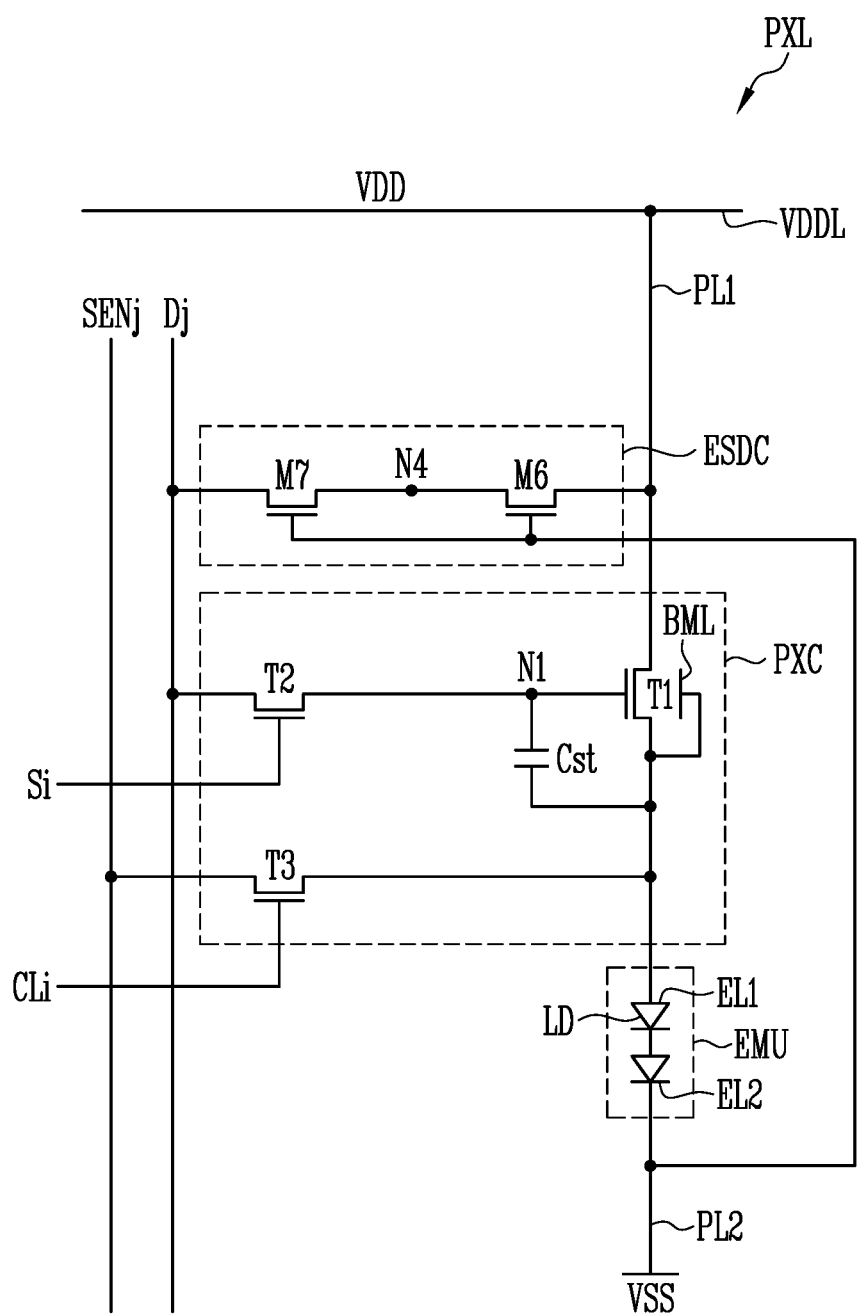

As illustrated in FIG. 6, in an embodiment, the electrostatic discharge circuit ESDC may include a sixth discharge transistor M6 and a seventh discharge transistor M7.

The sixth discharge transistor M6 and the seventh discharge transistor M7 may be electrically coupled between a first driving power source VDD and a data line Dj, and may be electrically connected in series to each other.

A first terminal of the sixth discharge transistor M6 may be electrically coupled to the first driving power source VDD, a second terminal of the sixth discharge transistor M6 may be electrically coupled to a fourth node N4, and a gate electrode of the sixth discharge transistor M6 may be electrically coupled to the second driving power source VSS.

A first terminal of the seventh discharge transistor M7 may be electrically coupled to the fourth node N4 (or the second terminal of the sixth discharge transistor M6), a second terminal of the seventh discharge transistor M7 may be electrically coupled to the data line Dj, and a gate electrode of the seventh discharge transistor M7 may be electrically coupled to the second driving power source VSS.

The display device according to an embodiment may include any one of the pixels PXL illustrated in FIGS. 2 to 6. For example, the display device may include only the pixel PXL illustrated in FIG. 3, may include only the pixel PXL illustrated in FIG. 4, may include only the pixel PXL illustrated in FIG. 5, or may include only the pixel PXL illustrated in FIG. 6. Further, the display device may include only the pixels PXL illustrated in FIGS. 2 and 3, may include only the pixels PXL illustrated in FIGS. 2 and 4, may include only the pixels PXL illustrated in FIGS. 2 and 5, or may include only the pixels PXL illustrated in FIGS. 2 and 6. The display device may be implemented using pixels PXL selected from among the pixels PXL illustrated in FIGS. 3 to 6.

Although an embodiment in which the first to seventh discharge transistors M1 to M7 are N-type transistors is illustrated in FIGS. 3 to 6, the disclosure is not limited thereto. In accordance with an embodiment, the first to seventh discharge transistors M1 to M7 may be replaced with P-type transistors.

Hereinafter, in case that static electricity flows from the outside into a display device including an electrostatic discharge circuit, the flow of the static electricity in the display device will be described with reference to FIGS. 7 to 11.

Figure 9:
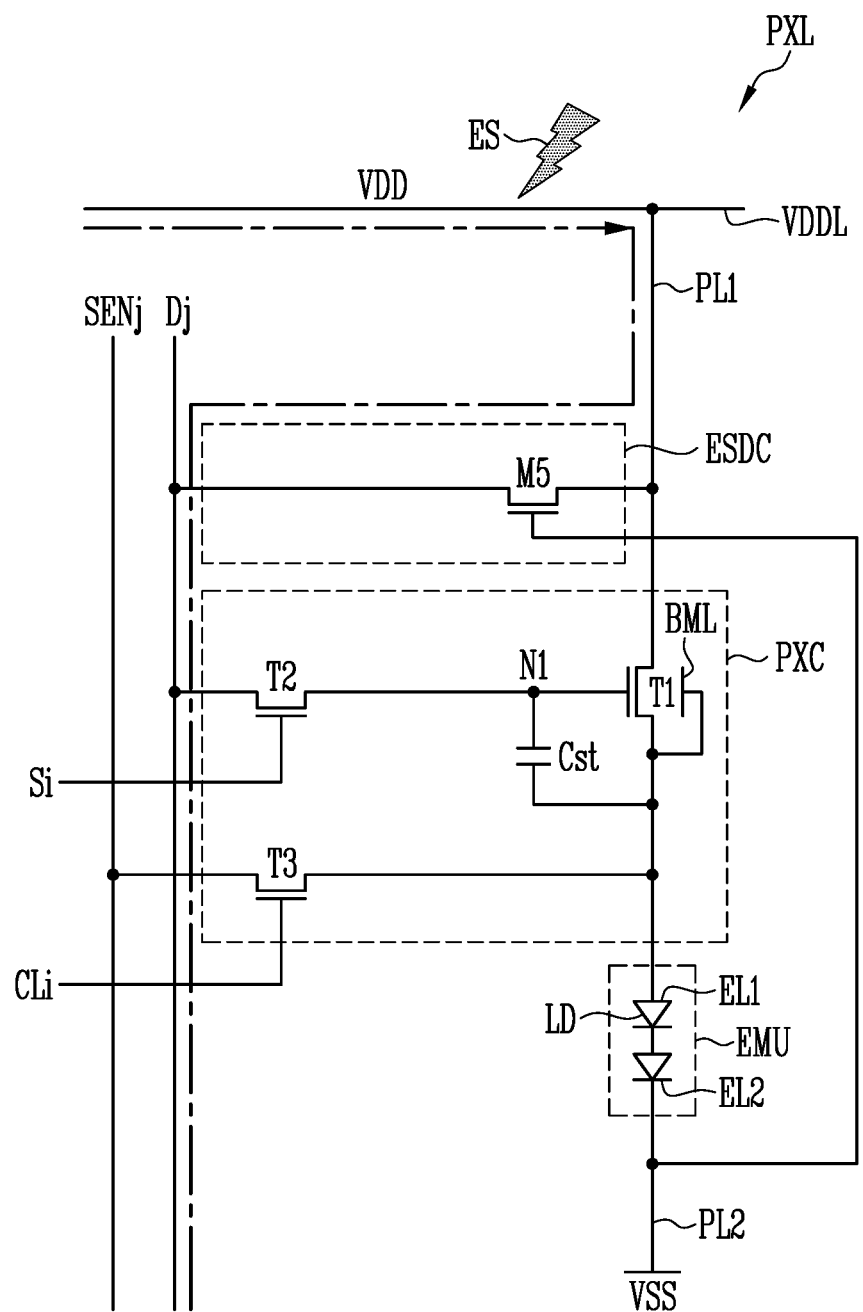
Figure 10:
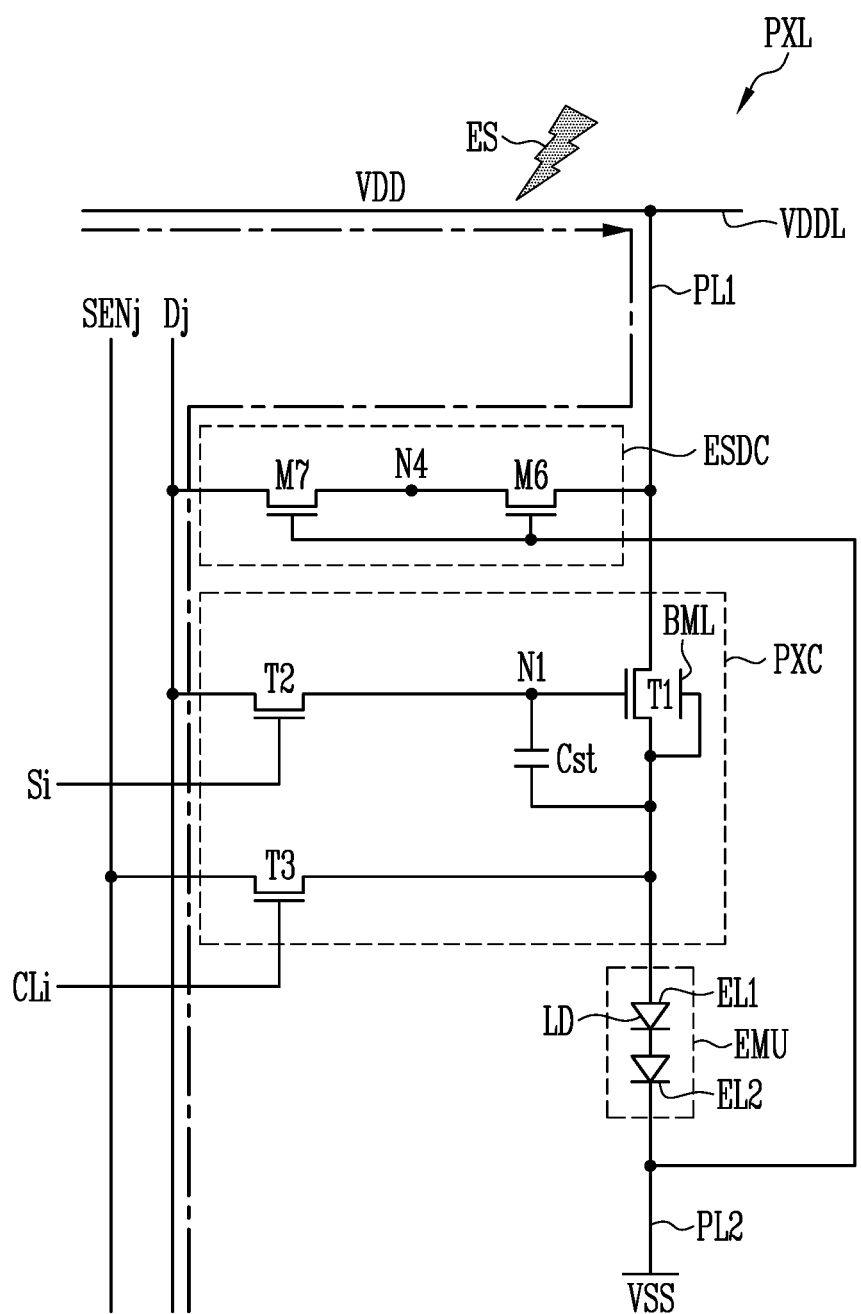
Figure 11:
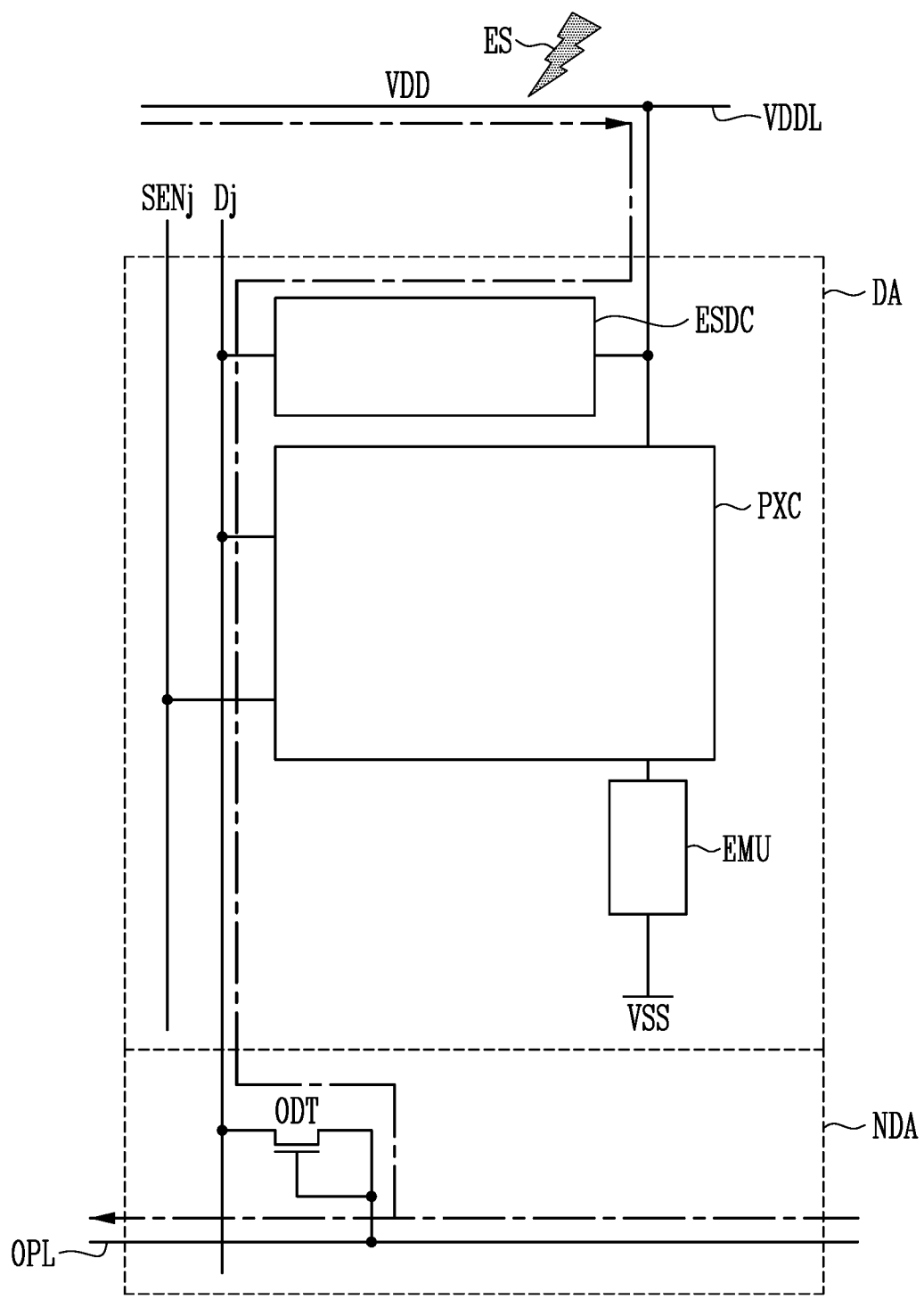
FIG. 11 is a schematic diagram for explaining the flow of static electricity flowing into a display area and a non-display area in a display device according to an embodiment.

FIGS. 7 to 10 are schematic diagrams for explaining the flow of static electricity flowing into a pixel in a display device according to an embodiment, and FIG. 11 is a diagram for explaining the flow of static electricity flowed into a display area and a non-display area in the display device according to an embodiment. The circuit diagrams illustrated in FIGS. 7 to 10 are identical to the circuit diagrams, described above with reference to FIGS. 3 to 6, and thus a description will be made based on the flow of static electricity in a pixel PXL.

Figure 7:
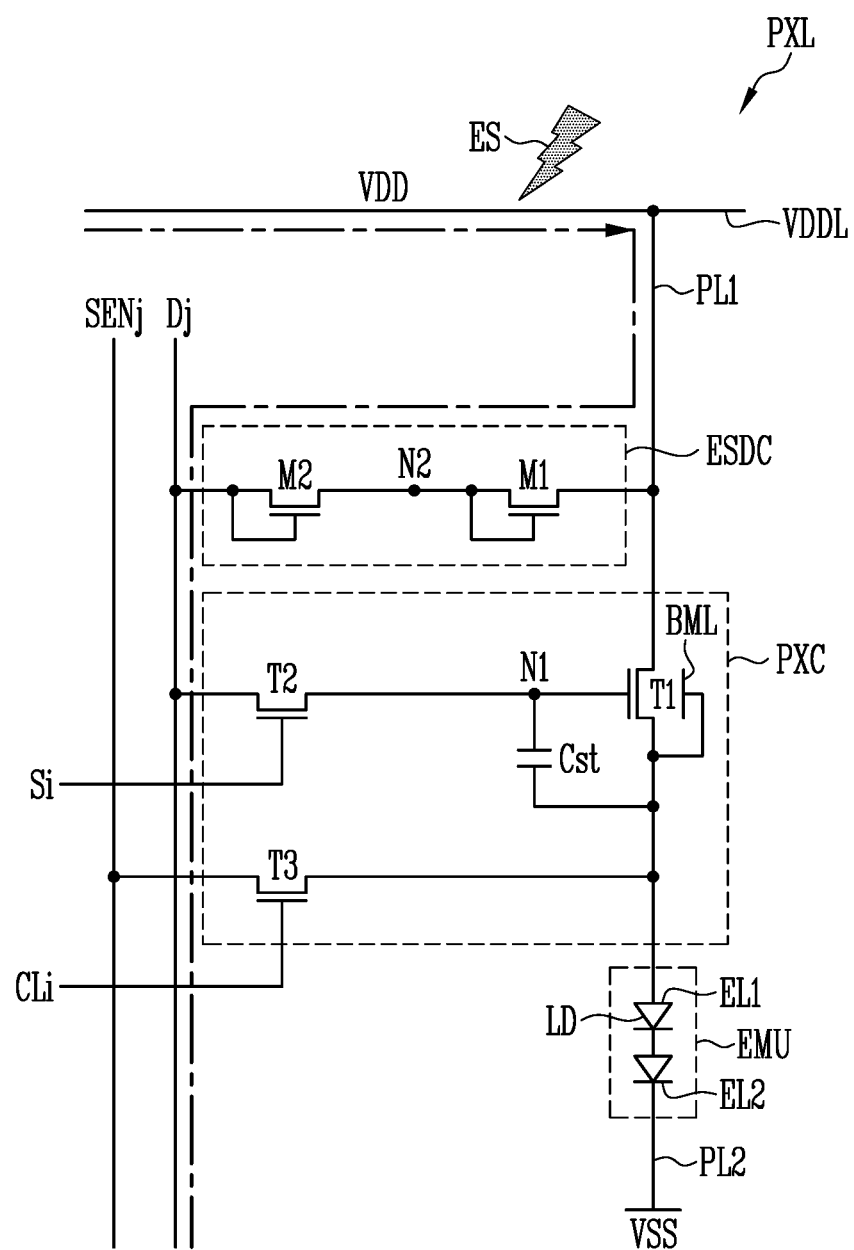
FIGS. 7 to 10 are schematic diagrams for explaining the flow of static electricity flowing into a pixel in a display device according to an embodiment.

Referring to FIG. 7, the pixel PXL according to an embodiment may include an electrostatic discharge circuit ESDC including a first discharge transistor M1 and a second discharge transistor M2.

In an embodiment, since the voltage of a first driving power source VDD may be higher than the data voltage of a data line Dj, static electricity ES flowed from the outside into the pixel PXL through a first driving power line VDDL may flow into the data line Dj through the first discharge transistor M1 and the second discharge transistor M2. The flow of the static electricity is indicated by a dotted arrow. Accordingly, the pixel PXL in the display area DA may discharge the static electricity ES, flowed from the outside through the first driving power line VDDL during a process, to a transistor in a non-display area NDA (see FIG. 1). Accordingly, in an embodiment, an electrostatic failure occurring in the display area DA due to the static electricity ES flowed from the outside may be prevented.

Each of the first discharge transistor M1 and the second discharge transistor M2 may be a transistor having a diode structure, wherein the gate-source voltage of the first discharge transistor M1 and the gate-source voltage of the second discharge transistor M2 may be 0 V. Accordingly, the pixel PXL of the display device according to an embodiment may prevent a leakage current through the electrostatic discharge circuit ESDC because the first discharge transistor M1 and the second discharge transistor M2 are turned off even if the pixel circuit PXC is driven.

Figure 8:
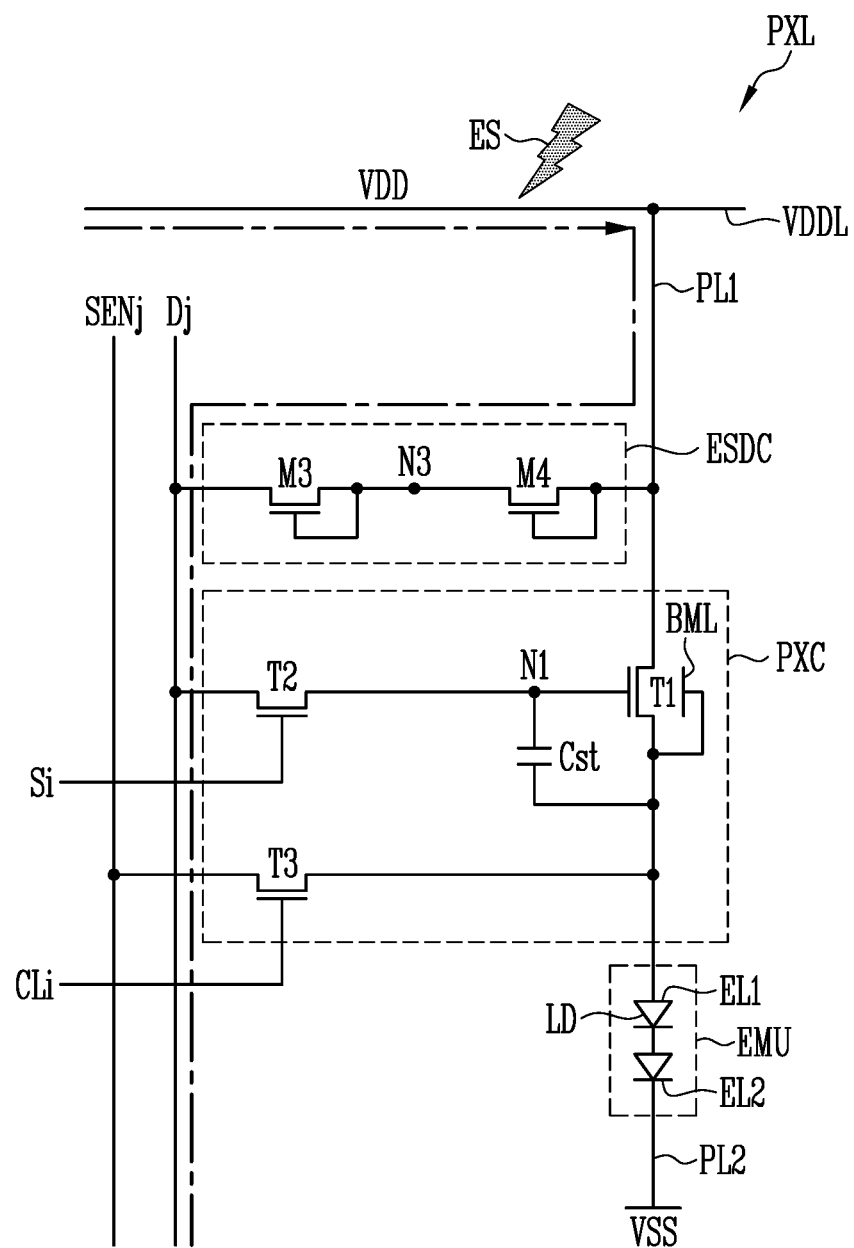

Referring to FIG. 8, the pixel PXL according to an embodiment may include an electrostatic discharge circuit ESDC including a third discharge transistor M3 and a fourth discharge transistor M4.

In an embodiment, since the voltage of a first driving power source VDD may be higher than the data voltage of a data line Dj, static electricity ES flowed from the outside into the pixel PXL through a first driving power line VDDL may flow into the data line Dj through the third discharge transistor M3 and the fourth discharge transistor M4. The flow of the static electricity is indicated by a dotted arrow. Accordingly, the pixel PXL in the display area DA may discharge the static electricity ES, flowed from the outside through the first driving power line VDDL during a process, to a transistor in a non-display area NDA (see FIG. 1). Accordingly, in an embodiment, an electrostatic failure in the display area DA due to the static electricity ES flowed from the outside may be prevented.

The channel lengths of the third discharge transistor M3 and the fourth discharge transistor M4 may be longer than those of the first discharge transistor M1 and the second discharge transistor M2. For example, the channel lengths of the first discharge transistor M1 and the second discharge transistor M2 may be about 7 μm, and the channel lengths of the third discharge transistor M3 and the fourth discharge transistor M4 may range from about 14 μm to about 35 μm.

The longer channel length of a transistor may mean that the resistance of the transistor is higher. Accordingly, the pixel PXL of the display device according to an embodiment may minimize a leakage current through the electrostatic discharge circuit ESDC by utilizing the third discharge transistor M3 and the fourth discharge transistor M4 having a longer channel length even if the pixel circuit PXC is driven.

Referring to FIG. 9, the pixel PXL according to an embodiment may include an electrostatic discharge circuit ESDC including a fifth discharge transistor M5.

In an embodiment, since the voltage of the first driving power source VDD may be higher than the data voltage of a data line Dj, static electricity ES flowed from the outside into the pixel PXL through a first driving power line VDDL may flow into the data line Dj through the fifth discharge transistor M5. The flow of the static electricity is indicated by a dotted arrow. Accordingly, the pixel PXL in the display area DA may discharge the static electricity ES, flowed from the outside through the first driving power line VDDL during a process, to a transistor in a non-display area NDA (see FIG. 1). Accordingly, in an embodiment, an electrostatic failure occurring in the display area DA due to the static electricity ES flowed from the outside may be prevented.

Because the gate electrode of the fifth discharge transistor M5 is electrically coupled to the second driving power source VSS, the gate-source voltage of the fifth discharge transistor M5 may have a negative value in case that the voltage of the second driving power source VSS is 0 V. Accordingly, the pixel PXL of the display device according to an embodiment may prevent a leakage current through the electrostatic discharge circuit ESDC because the fifth discharge transistor M5 is turned off even if the pixel circuit PXC is driven.

Referring to FIG. 10, the pixel PXL according to an embodiment may include an electrostatic discharge circuit ESDC including a sixth discharge transistor M6 and a seventh discharge transistor M7.

In an embodiment, since the voltage of a first driving power source VDD may be higher than the data voltage of a data line Dj, static electricity ES flowed from the outside into the pixel PXL through a first driving power line VDDL may flow into the data line Dj through the sixth discharge transistor M6 and the seventh discharge transistor M7. The flow of the static electricity is indicated by a dotted arrow. Accordingly, the pixel PXL in the display area DA may discharge the static electricity ES, flowed from the outside through the first driving power line VDDL during a process, to a transistor in a non-display area NDA (see FIG. 1). Accordingly, in an embodiment, an electrostatic failure occurring in the display area DA due to the static electricity ES flowed from the outside may be prevented.

Because the gate electrode of the sixth discharge transistor M6 and the gate electrode of the seventh discharge transistor M7 are electrically coupled to the second driving power source VSS, the gate-source voltage of the sixth discharge transistor M6 and the gate-source voltage of the seventh discharge transistor M7 may have a negative value in case that the voltage of the second driving power source VSS is 0 V. Accordingly, the pixel PXL of the display device according to an embodiment may prevent a leakage current through the electrostatic discharge circuit ESDC because the sixth discharge transistor M6 and the seventh discharge transistor M7 are turned off even if the pixel circuit PXC is driven. Since the electrostatic discharge circuit ESDC illustrated in FIG. 10 includes more discharge transistors than those in the electrostatic discharge circuit ESDC illustrated in FIG. 9, it may prevent a leakage current more efficiently than the electrostatic discharge circuit ESDC of FIG. 9.

Referring to FIG. 11, the pixel PXL according to an embodiment may include an electrostatic discharge circuit ESDC, a pixel circuit PXC, and an emission unit EMU. Here, the electrostatic discharge circuit ESDC may correspond to one of the electrostatic discharge circuits ESDC illustrated in FIGS. 7 to 10.

An outer discharge transistor ODT disposed in a non-display area NDA may include a first terminal electrically coupled to a data line Dj, a second terminal electrically coupled to an outer connection line OPL, and a gate electrode electrically coupled to the outer connection line OPL (or the second terminal of the outer discharge transistor ODT). Here, the outer connection line OPL may correspond to one of a signal line, a voltage line, or a dummy line disposed in the non-display area NDA.

Since the voltage of the first driving power source VDD may be higher than the data voltage of the data line Dj, static electricity ES flowed from the outside through a first driving power line VDDL may flow into the data line Dj through the electrostatic discharge circuit ESDC. The flow of the static electricity is indicated by a dotted arrow.

The pixel PXL in the display area DA may bypass the static electricity ES, flowed from the outside through the first driving power line VDDL during a process, to the outer discharge transistor ODT in the non-display area NDA through the electrostatic discharge circuit ESDC and the data line Dj. Accordingly, the embodiment may prevent a short-circuit in case that an insulating layer between the first driving power line VDDL and the data line Dj is damaged in a portion in which the first driving power line VDDL overlaps the data line Dj due to the static electricity ES flowed from the outside.

For example, in an embodiment, an electrostatic failure in the display area DA due to static electricity ES flowed from the outside may be prevented, and thus the yield of the display device may be enhanced, reliability of the display device may be obtained, and product quality may be improved.

Hereinafter, the arrangement of an electrostatic discharge circuit in a display device according to an embodiment will be described in detail with reference to FIG. 12.

Figure 12:
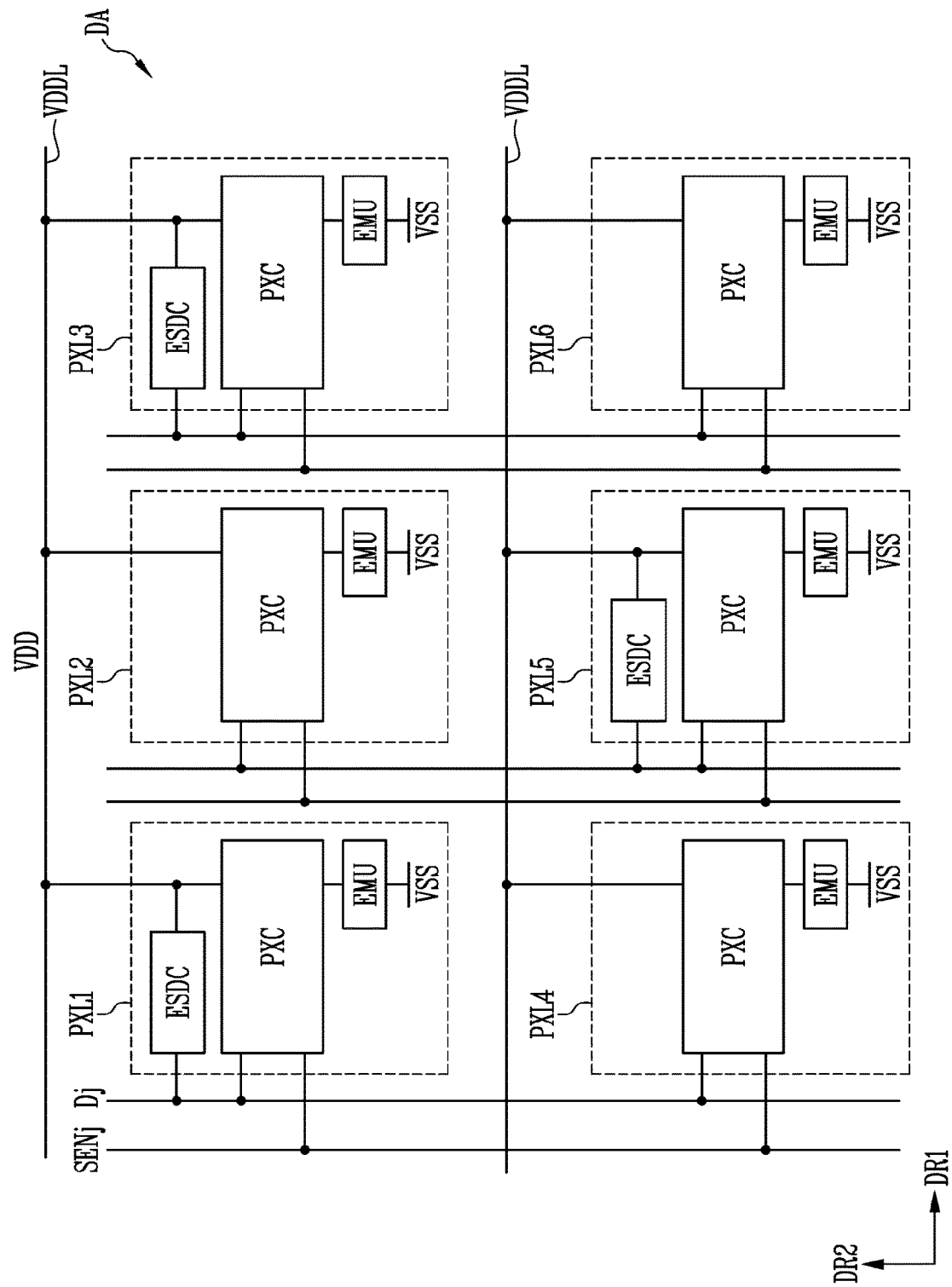
FIG. 12 is a schematic diagram illustrating multiple pixels in a display area of a display device according to an embodiment.

FIG. 12 is a schematic diagram illustrating multiple pixels in a display area of the display device according to an embodiment.

Referring to FIG. 12, multiple pixels PXL may be arranged in the display area DA according to an embodiment. The multiple pixels PXL may be arranged to be spaced apart from each other in a first direction DR1 (or a row direction) and a second direction DR2 (or a column direction). The multiple pixels PXL may include a first pixel PXL1, a second pixel PXL2, a third pixel PXL3, a fourth pixel PXL4, a fifth pixel PXL5, and a sixth pixel PXL6.

Also, a first driving power line VDDL may extend in the first direction DR1, and a multiple first driving power lines VDDL may be disposed to be spaced apart from each other in the second direction DR2.

For example, the first pixel PXL1, the second pixel PXL2, and the third pixel PXL3 may be arranged in parallel while being spaced apart from each other in the first direction DR1, and may be electrically connected to the corresponding first driving power lines VDDL extending in the first direction DR1. For example, the fourth pixel PXL4, the fifth pixel PXL5, and the sixth pixel PXL6 may be arranged in parallel while being spaced apart from each other in the first direction DR1, and may be electrically connected to the corresponding first driving power line VDDL extending in the first direction DR1.

In an embodiment, among the multiple pixels PXL, only designated pixels PXL may further include an electrostatic discharge circuit ESDC. Here, the designated pixels PXL may mean that only some pixels PXL among the multiple pixels PXL consecutive in the first direction DR1 and the second direction DR2 may include an electrostatic discharge circuit ESDC. In detail, in case that M pixels PXL are consecutively disposed in the first direction DR1 and N pixels PXL are consecutively disposed in the second direction DR2, a first, third, and fifth pixels PXL among the pixels in a first pixel row consecutively disposed in the first direction DR1 may further include the electrostatic discharge circuit ESDC, and a second, fourth, and sixth pixels PXL among the pixels in a second pixel row may further include an electrostatic discharge circuit ESDC. For example, each of the first pixel PXL1 and the third pixel PXL3 in the first pixel row may further include an electrostatic discharge circuit ESDC, and the fifth pixel PXL5 in the second pixel row may further include an electrostatic discharge circuit ESDC. Each of the second pixel PXL2, the fourth pixel PXL4, and the sixth pixel PXL6 may include a pixel circuit PXC and an emission unit EMU. For example, the display device according to an embodiment may be configured such that, among multiple pixels PXL, some pixels PXL may include an electrostatic discharge circuit ESDC, thus securing the aperture ratio of the display device and efficiently utilizing the display area DA.

Hereinafter, a light-emitting element according to an embodiment will be described in detail with reference to FIG. 13.

Figure 13:
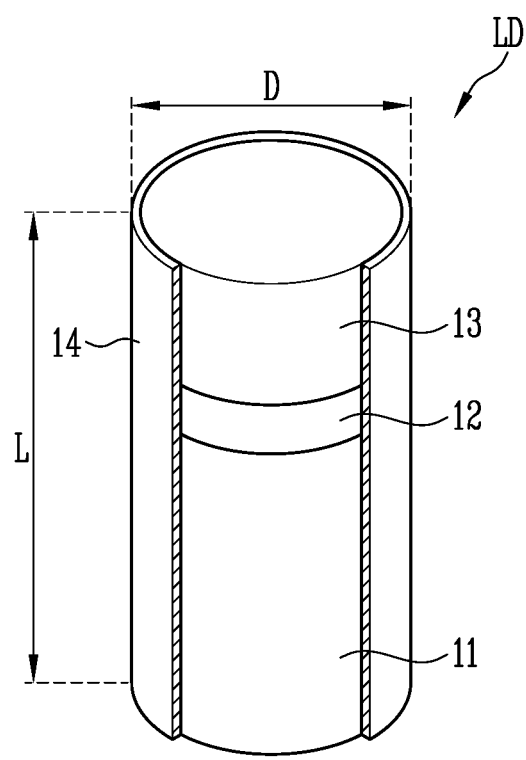
FIG. 13 is a perspective view illustrating a light-emitting element included in a display device according to an embodiment.

FIG. 13 is a perspective view illustrating a light-emitting element included in a display device according to an embodiment.

The light-emitting element LD included in the display device according to an embodiment may include a first semiconductor layer 11, a second semiconductor layer 13, and an active layer 12 disposed between the first semiconductor layer 11 and the second semiconductor layer 13. For example, the light-emitting element LD may be implemented as a stacked body in which the first semiconductor layer 11, the active layer 12, and the second semiconductor layer 13 are sequentially stacked each other in a longitudinal direction L.

The light-emitting element LD may be provided in a rod shape, for example, a cylindrical shape, which extends in one direction. In case that the extending direction of the light-emitting element LD is defined as the longitudinal direction L, the light-emitting element LD may have a first end and a second end in the longitudinal direction L. Although a column-shaped light-emitting element LD is illustrated in FIG. 13, the type and/or shape of the light-emitting element according to an embodiment are not limited thereto.

The first semiconductor layer 11 may include at least one N-type semiconductor layer. For instance, the first semiconductor layer 11 may include an N-type semiconductor layer which includes any one semiconductor material, among InAlGaN, GaN, AlGaN, InGaN, AlN, and InN, and may be doped with a first conductive dopant such as Si, Ge, or Sn. However, the material forming the first semiconductor layer 11 is not limited thereto, and the first semiconductor layer 11 may be formed of various materials in addition to the described materials.

The active layer 12 may be disposed on the first semiconductor layer 11, and may be formed to have a single or multi-quantum well structure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or InAlGaN may be used to form the active layer 12, and various other materials may be used to form the active layer 12.

In case that a voltage equal to or greater than a threshold voltage is applied to both ends of the light-emitting element LD, the light-emitting element LD may emit light while electrons and holes are coupled to each other to form electron-hole pairs in the active layer 12. Since light emission by the light-emitting element LD may be controlled based on the foregoing principle, the light-emitting element LD may be used as a light source of various light-emitting devices as well as pixels of the display device.

The second semiconductor layer 13 may be disposed on the active layer 12, and may include a semiconductor layer of a type different from that of the first semiconductor layer 11. For example, the second semiconductor layer 13 may include at least one P-type semiconductor layer. For instance, the second semiconductor layer 13 may include a P-type semiconductor layer which includes at least one semiconductor material, among InAlGaN, GaN, AlGaN, InGaN, AlN, and InN, and may be doped with a second conductive dopant such as Mg, Zn, Ca, Sr, or Ba. However, the material forming the second semiconductor layer 13 is not limited thereto, and the second semiconductor layer 13 may be formed of various materials in addition to the described materials.

In the above-described embodiment, although the case where each of the first semiconductor layer 11 and the second semiconductor layer 13 is configured as one layer is described, the disclosure is not limited thereto. In an embodiment, each of the first semiconductor layer 11 and the second semiconductor layer 13 may include one or more layers, e.g., a cladding layer and/or a Tensile Strain Barrier Reducing (TSBR) layer, depending on the material of the active layer 12. The TSBR layer may be a strain buffer layer in which a lattice structure may be interposed between other semiconductor layers and which may function as a buffer for reducing a difference between lattice constants. The TSBR layer may be formed of a P-type semiconductor layer such as p-GaInP, p-AlInP, or p-AlGaInP, but the disclosure is not limited thereto.

Further, in an embodiment, the light-emitting element LD may include an insulating layer 14 provided on the surface thereof. The insulating layer 14 may be formed on the surface of the light-emitting element LD to surround an outer circumferential surface of the active layer 12. The insulating layer 14 may surround at least a portion of each of the first and second semiconductor layers 11 and 13. However, in accordance with an embodiment, the insulating layer 14 may expose the opposite ends of the light-emitting element LD having different polarities. For example, the insulating layer 14 may expose the first end of each of the first and second semiconductor layers 11 and 13 that are disposed on opposite ends of the light-emitting element LD with respect to the longitudinal direction L, e.g., may expose each of two base sides of a cylinder (e.g., top and bottom surfaces of the light-emitting element LD).

In case that the insulating layer 14 is provided on the surface of the light-emitting element LD, particularly, on the surface of the active layer 12, the active layer 12 may be prevented from short-circuiting with at least one electrode (not shown) (e.g., at least one of contact electrodes coupled to the opposite ends of the light-emitting element LD). Consequently, the electrical stability of the light-emitting element LD may be obtained.

Furthermore, since the insulating layer 14 may be formed on the surface of the light-emitting element LD, a defect on the surface of the light-emitting element LD may be minimized, whereby the lifetime and efficiency of the light-emitting element LD may be improved. In case that each light-emitting element LD includes the insulating layer 14, even in case that multiple light-emitting elements LD are disposed closer to each other, the light-emitting elements LD may be prevented from undesirably short-circuiting with each other.

In an embodiment, a surface treatment process may be performed to manufacture each light-emitting element LD. For example, in case that the multiple light-emitting elements LD are mixed with a liquid solution (or a solvent) and are supplied to respective emission areas (e.g., emission areas of respective pixels), the surfaces of the light-emitting elements LD may be treated such that the light-emitting elements LD are homogeneously dispersed into the solution without being heterogeneously condensed in the solution.

In an embodiment, each light-emitting element LD may further include additional components in addition to the first semiconductor layer 11, the active layer 12, the second semiconductor layer 13, and the insulating layer 14. For example, the light-emitting element LD may further include one or more fluorescent layers, active layers, semiconductor layers and/or electrodes disposed on first ends of the first semiconductor layer 11, the active layer 12, and the second semiconductor layer 13.

The light-emitting element LD may be used in various types of devices requiring a light source, as well as a display device. For example, one or more light-emitting elements LD, for example, multiple light-emitting elements LD, each having a nanoscale to microscale size, may be disposed in each pixel of the display device, and light sources (or light source units) of respective pixels may be arranged using the light-emitting elements LD. However, the field of application of the light-emitting elements LD in the disclosure is not limited to display devices. For example, the light-emitting elements LD may also be used in other types of devices such as a lighting device, which requires a light source.

In accordance with an embodiment, static electricity flowed from the outside into a display area through a first driving power line during a process may be bypassed to a discharge transistor in a non-display area through an electrostatic discharge circuit and a data line, so electrostatic failures in the display area may be prevented, and thus the yield of a display device may be enhanced, reliability of the display device may be obtained, and product quality may be improved.

Further, in accordance with an embodiment, among multiple pixels, only some pixels may include an electrostatic discharge circuit, whereby an aperture ratio of the display device may be secured, and a display area may be efficiently used.

The effects according to the embodiments are not limited by the foregoing descriptions, and various effects are included in the specification.

While various embodiments have been described above, those skilled in the art will appreciate that various modifications, additions and substitutions are possible, without departing from the scope and spirit of the disclosure described in the accompanying claims.

Therefore, the embodiments disclosed in this specification are only for illustrative purposes rather than limiting the technical spirit of the disclosure. The scope of the disclosure must be defined by the accompanying claims.

What is claimed is:

1. A display device, comprising:
 a base layer including a display area and a non-display area adjacent to the display area;
 an emission unit including:
  a first electrode electrically connected to a first driving power source;
  a second electrode electrically connected to a second driving power source; and
  a light-emitting element disposed between the first electrode and the second electrode;
 a first transistor including:
  a first terminal electrically connected to the first driving power source;
  a second terminal electrically connected to the first electrode of the emission unit; and
  a gate electrode electrically connected to a first node;
 a second transistor including:
  a first terminal electrically connected to a data line;
  a second terminal electrically connected to the first node; and
  a gate electrode electrically connected to a scan line;
 an electrostatic discharge circuit disposed in the display area and disposed between the first driving power source and the data line; and
 an outer discharge transistor disposed in the non-display area the outer discharge transistor including:
  a first terminal electrically connected to the data line;
  a second terminal electrically connected to an outer connection line, and
  a gate electrode electrically connected to the outer connection line.

2. The display device according to claim 1, wherein the electrostatic discharge circuit is electrically connected to the first transistor and the second transistor.

3. The display device according to claim 1, wherein the electrostatic discharge circuit comprises:
 a first discharge transistor including:
  a first terminal electrically connected to the first driving power source;
  a second terminal electrically connected to a third node; and
  a gate electrode electrically connected to the third node; and
 a second discharge transistor including:
  a first terminal electrically connected to the third node;
  a second terminal electrically connected to the data line; and
  a gate electrode electrically connected to the data line.

4. The display device according to claim 1, wherein the electrostatic discharge circuit comprises:
 a third discharge transistor including:
  a first terminal electrically connected to the data line;
  a second terminal electrically connected to a fourth node; and
  a gate electrode electrically connected to the fourth node; and
 a fourth discharge transistor including:
  a first terminal electrically connected to the fourth node;
  a second terminal electrically connected to the first driving power source; and
  a gate electrode electrically connected to the first driving power source.

5. The display device according to claim 1, wherein
 the electrostatic discharge circuit includes one or more discharge transistors, and
 each of the one or more discharge transistors has a channel length of about 7 μm.

6. The display device according to claim 1, wherein a voltage of the first driving power source is higher than a voltage of the second driving power source.

7. The display device according to claim 1, further comprising:
 a third transistor including:
  a first terminal electrically connected to the second terminal of the first transistor;
  a second terminal electrically connected to a sensing line; and
  a gate electrode electrically connected to a control line; and
 a storage capacitor including:
  a first electrode electrically connected to the first node; and
  a second electrode electrically connected to the second terminal of the first transistor.

8. The display device according to claim 1, wherein the light-emitting element comprises:
 a first semiconductor layer;
 a second semiconductor layer; and
 an active layer disposed between the first semiconductor layer and the second semiconductor layer.

9. A display device, comprising:
 a base layer including a display area and a non-display area adjacent to the display area;
 an emission unit including:
  a first electrode electrically connected to a first driving power source;
  a second electrode electrically connected to a second driving power source different from the first driving power source; and
  a light-emitting element disposed between the first electrode and the second electrode;
 a first transistor including:
  a first terminal electrically connected to the first driving power source;
  a second terminal electrically connected to the first electrode of the emission unit; and
  a gate electrode electrically connected to a first node;
 a second transistor including:
  a first terminal electrically connected to a data line;
  a second terminal electrically connected to the first node; and
  a gate electrode electrically connected to a scan line; and
 an electrostatic discharge circuit disposed in the display area and disposed between the first driving power source and the data line, the electrostatic discharge circuit being controlled by the second driving power source.

10. The display device according to claim 9, wherein the electrostatic discharge circuit is electrically connected to the first transistor and the second transistor.

11. The display device according to claim 9, wherein the electrostatic discharge circuit comprises:
 a fifth discharge transistor including:
  a first terminal electrically connected to the first driving power source;

a second terminal electrically connected to the data line; and
a gate electrode electrically connected to the second driving power source.

12. The display device according to claim 9, wherein the electrostatic discharge circuit comprises:
a sixth discharge transistor including:
a first terminal electrically connected to the first driving power source;
a second terminal electrically connected to a fifth node; and
a gate electrode electrically connected to the second driving power source; and
a seventh discharge transistor including:
a first terminal electrically connected to the fifth node;
a second terminal electrically connected to the data line; and
a gate electrode electrically connected to the second driving power source.

13. The display device according to claim 9, further comprising:
an outer discharge transistor disposed in the non-display area, the outer discharge transistor including:
a first terminal electrically connected to the data line;
a second terminal electrically connected to an outer connection line; and
a gate electrode electrically connected to the outer connection line.

14. The display device according to claim 9, wherein a voltage of the first driving power source is higher than a voltage of the second driving power source.

15. The display device according to claim 9, further comprising:
a third transistor including:
a first terminal electrically connected to the first terminal of the first transistor;
a second terminal electrically connected to a sensing line; and
a gate electrode electrically connected to the sensing line; and
a storage capacitor including:
a first electrode electrically connected to the first node; and
a second electrode electrically connected to the second terminal of the first transistor.

16. The display device according to claim 9, wherein the light-emitting element comprises:
a first semiconductor layer;
a second semiconductor layer; and
an active layer disposed between the first semiconductor layer and the second semiconductor layer.

17. A display device, comprising:
a base layer including a plurality of pixels arranged in a first direction and a second direction perpendicular to the first direction, wherein
each of the plurality of pixels comprises:
an emission unit including:
a first electrode electrically connected to a first driving power source;
a second electrode electrically connected to a second driving power source; and
a light emitting element disposed between the first electrode and the second electrode; and
a pixel circuit including a first transistor, the first transistor including:
a first terminal electrically connected to the first driving power source;
a second terminal electrically connected to the first electrode of the emission unit; and
a gate electrode electrically connected to a first node, and
every other pixel among the plurality of pixels arranged in the first direction and every other pixel among the plurality of pixels arranged in the second direction comprises a corresponding electrostatic discharge circuit disposed in a display area of the display device and between the first driving power source and a corresponding data line.

18. The display device according to claim 1, wherein
the electrostatic discharge circuit includes one or more discharge transistors, and
each of the one or more discharge transistors has a channel length in a range of about 14 μm to about 35 μm.

19. The display device according to claim 17, wherein each of the electrostatic discharge circuits is electrically connected to the second driving power source and is controlled by the second driving power source.

20. The display device according to claim 17, wherein the light-emitting element comprises:
a first semiconductor layer;
a second semiconductor layer; and
an active layer disposed between the first semiconductor layer and the second semiconductor layer.

* * * * *